(12) United States Patent
Wallace et al.

(10) Patent No.: US 9,793,159 B2
(45) Date of Patent: *Oct. 17, 2017

(54) PREVIOUS LAYER SELF-ALIGNED VIA AND PLUG PATTERNING FOR BACK END OF LINE (BEOL) INTERCONNECTS

(71) Applicant: Intel Corporation, Santa Clara, CA (US)

(72) Inventors: Charles H. Wallace, Portland, OR (US); Paul A. Nyhus, Portland, OR (US); Elliot N. Tan, Portland, OR (US); Swaminathan Sivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/911,991

(22) PCT Filed: Sep. 27, 2013

(86) PCT No.: PCT/YS2013/062327
§ 371 (c)(1),
(2) Date: Feb. 12, 2016

(87) PCT Pub. No.: WO2015/047321
PCT Pub. Date: Apr. 2, 2015

(65) Prior Publication Data
US 2016/0190009 A1 Jun. 30, 2016

(51) Int. Cl.
*H01L 21/768* (2006.01)
*H01L 23/528* (2006.01)
(Continued)

(52) U.S. Cl.
CPC .. *H01L 21/76883* (2013.01); *H01L 21/76801* (2013.01); *H01L 21/76802* (2013.01);
(Continued)

(58) Field of Classification Search
CPC .......... H01L 21/76883; H01L 23/5329; H01L 23/5226; H01L 21/76802; H01L 21/76829;
(Continued)

(56) References Cited

U.S. PATENT DOCUMENTS 5,888,897 A 3/1999 Liang
9,236,292 B2 * 1/2016 Romero ............ H01L 21/76838
(Continued)

FOREIGN PATENT DOCUMENTS

TW 424302 3/2001

OTHER PUBLICATIONS

International Search Report and Written Opinion from PCT/US2013/062327 mailed Jun. 25, 2014, 15 pgs.
(Continued)

*Primary Examiner* — Caleen Sullivan
(74) *Attorney, Agent, or Firm* — Schwabe Williamson & Wyatt P.C.

(57) ABSTRACT

Previous layer self-aligned via and plug patterning for back end of line (BEOL) interconnects are described. In an example, an interconnect structure for an integrated circuit includes a first layer disposed above a substrate. The first layer of the interconnect structure includes a grating of alternating metal lines and dielectric lines in a first direction. A second layer of the interconnect structure is disposed above the first layer. The second layer includes a grating of alternating metal lines and dielectric lines in a second direction, perpendicular to the first direction. Each metal line of the grating of the second layer is disposed on a recessed dielectric line composed of alternating distinct regions of a first dielectric material and a second dielectric material corresponding to the alternating metal lines and dielectric lines of the first layer of the interconnect structure.

18 Claims, 14 Drawing Sheets

(51) Int. Cl.
*H01L 23/522* (2006.01)
*H01L 23/532* (2006.01)

(52) U.S. Cl.
CPC .. *H01L 21/76807* (2013.01); *H01L 21/76816* (2013.01); *H01L 21/76829* (2013.01); *H01L 21/76897* (2013.01); *H01L 23/528* (2013.01); *H01L 23/5226* (2013.01); *H01L 23/5329* (2013.01); *H01L 2924/0002* (2013.01)

(58) Field of Classification Search
CPC ............. H01L 21/76897; H01L 23/528; H01L 21/76807; H01L 21/76816; H01L 2924/0002; H01L 2924/00; H01L 21/76801; H01L 21/28562; H01L 21/76879; H01L 21/28506; H01L 21/76813; H01L 21/7682; H01L 23/53295; H01L 21/486; H01L 21/76808; C23C 16/18; C23C 16/04; C23C 16/45525; C23C 16/45553
USPC .................................. 257/774; 438/623, 631
See application file for complete search history.

(56) References Cited

U.S. PATENT DOCUMENTS

| | | |
|---|---|---|
| 2005/0233503 A1 | 10/2005 | Leib et al. |
| 2008/0251933 A1 | 10/2008 | Cho et al. |
| 2009/0032967 A1 | 2/2009 | Becker et al. |
| 2010/0032846 A1 | 2/2010 | Chidambarrao et al. |
| 2012/0313251 A1 | 12/2012 | Kato |
| 2013/0230981 A1 | 9/2013 | Kawamura |
| 2013/0252420 A1 | 9/2013 | Sandhu |
| 2016/0204002 A1* | 7/2016 | Wallace ............ H01L 21/76897 257/773 |

OTHER PUBLICATIONS

Non-Final Office Action for Taiwan Patent Application No. 103130412 Mailed Oct. 26, 2015, 3 pages.
International Preliminary Report on Patentability for PCT Patent Application No. PCT/US2013/062327 mailed Apr. 7, 2016, 7 pgs.
Supplementary European Search Report for European Patent Application No. 13894291 mailed Apr. 5, 2017, 7 pgs.

* cited by examiner

PREVIOUS LAYER SELF-ALIGNED VIA AND PLUG PATTERNING FOR BACK END OF LINE (BEOL) INTERCONNECTS

CLAIM OF PRIORITY

This application is a U.S. National Phase application under 35 U.S.C. §371 of International Application No. PCT/US2013/062327, filed Sep. 27, 2013, entitled "PREVIOUS LAYER SELF-ALIGNED VIA AND PLUG PATTERNING FOR BACK END OF LINE (BEOL) INTERCONNECTS" the entire contents of which are incorporated herein by reference.

TECHNICAL FIELD

Embodiments of the invention are in the field of semiconductor structures and processing and, in particular, previous layer self-aligned via and plug patterning for back end of line (BEOL) interconnects.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIG. 1 illustrates a plan view and corresponding cross-sectional views of options for a previous layer metallization structure;

FIG. 2 illustrates a plan view and corresponding cross-sectional views of options for directed self-assembly (DSA) growth on the underlying metal/ILD grating structure of FIG. 1;

FIG. 3 illustrates a plan view and corresponding cross-sectional view of the structure of FIG. 2 following removal of one species of polymer;

FIG. 4 illustrates a plan view and corresponding cross-sectional views of the structure of FIG. 3 following formation of a sacrificial material layer over the metal lines;

FIG. 5 illustrates a plan view and corresponding cross-sectional views of the structure of FIG. 4 following replacement of Polymer A with a permanent interlayer dielectric (ILD) material;

FIG. 6 illustrates a plan view and corresponding cross-sectional views of the structure of FIG. 5 following selective hardmask formation on the permanent ILD lines;

FIG. 7 illustrates a plan view and corresponding cross-sectional views of the structure of FIG. 6 following removal of Sacrificial B lines and replacement with permanent ILD lines;

FIG. 8 illustrates a plan view and corresponding cross-sectional views of the structure of FIG. 7 following trench formation (e.g., grating definition);

FIG. 9 illustrates a plan view and corresponding cross-sectional views of the structure of FIG. 8 following formation of a sacrificial material grating in the trenches of FIG. 8;

FIG. 10 illustrates a plan view and corresponding cross-sectional views of the structure of FIG. 9 following formation and patterning of a mask and subsequent etching of via locations;

FIG. 11 illustrates a plan view and corresponding cross-sectional views of the structure of FIG. 10 following mask and hardmask removal and subsequent plug patterning and etch;

FIG. 12 illustrates a plan view and corresponding cross-sectional views of the structure of FIG. 11 following mask removal and metal line trench etch; and FIG. 13 illustrates a plan view and corresponding cross-sectional views of the structure of FIG. 12 following metal line deposition and polish.

DESCRIPTION OF THE EMBODIMENTS

Figure 1:
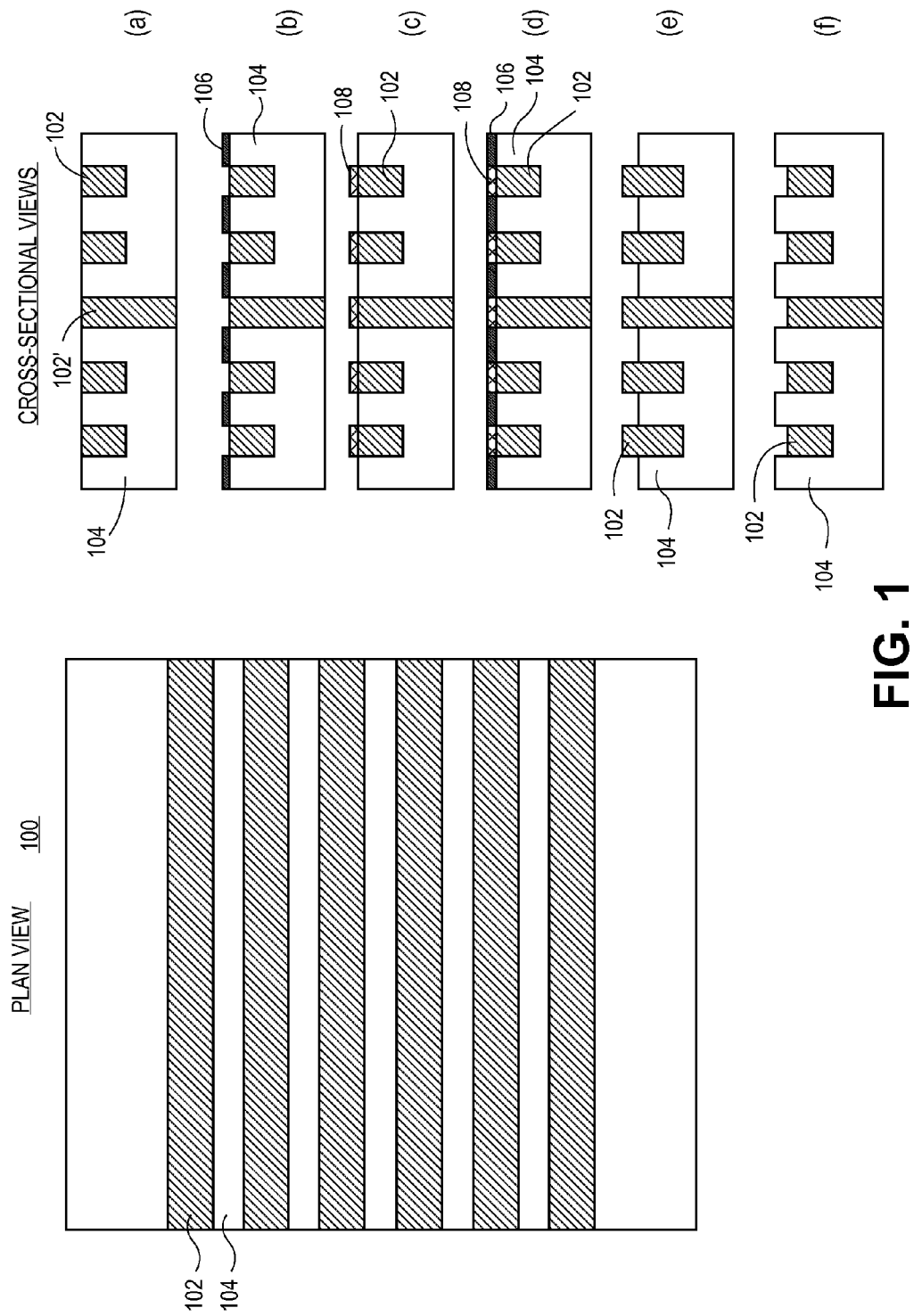
FIGS. 1-13 illustrate portions of integrated circuit layers representing various operations in a method of self-aligned via and metal patterning, in accordance with an embodiment of the present invention, where.

Previous layer self-aligned via and plug patterning for back end of line (BEOL) interconnects are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to previous layer self-aligned via and plug patterning. The self-aligned aspect of the processes described herein may be based on a directed self-assembly (DSA) mechanism, as described in greater detail below. However, it is to be understood that selective growth mechanisms may be employed in place of, or in combination with, DSA-based approaches. In an embodiment, processes described herein enable realization of self-aligned metallization for back-end of line feature fabrication.

To provide context, patterning and aligning of features at less than approximately 50 nanometer pitch requires many reticles and critical alignment strategies that are extremely expensive for a semiconductor manufacturing process.

Generally, embodiments described herein involve the fabrication of metal and via patterns based on the positions of an underlying layer. That is, in contrast to conventional top-down patterning approaches, a metal interconnect process is effectively reversed and built from the previous layer up. This is in contrast to a conventional approach where an interlayer dielectric (ILD) is first deposited, with a pattern for metal and via layers subsequently patterned therein. In the conventional approach, alignment to a previous layer is performed using a lithography scanner alignment system. The ILD is then etched.

More specifically, one or more embodiments are directed to an approach that employs an underlying metal as a template to build the conductive vias and non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment no longer affects via or plug placements. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

As illustrated below, self-aligned via and metal patterning approaches described herein may include one or more of the following aspects or attributes: (a) a bottom up super-self-aligned via/metal patterning process is enabled; (b) a previous layer metal is used to direct positions of vias on the layer formed above; (c) a process that generates every possible via and metal line end position fully aligned but maintains only required or desired via and metal line end positions; (d) the position and shape of vias and metal line ends are pre-formed from a previous layer pattern; (e) an intersection of metal below and above naturally forms the fully self-aligned via positions; (f) via and plugs position, size and shape are defined by a pre-existing grating lithography from underlying metal layers; (g) via and plug lithography is required only for selecting one or another and does not affect the position, shape, CDU, roughness, or size of the features (e.g., LWR is irrelevant); (h) processes described herein may be characterized as an upside down dual-damascene or via/plug first approach; (i) corresponding lithography photoresist design can be simplified since greater tolerance is achieved in the selection of via and plug locations within a layer (this may be referred to as a "bucket" approach, where a photoresist is merely used fill a plurality of generated holes, where only certain holes are subsequently selected to be maintained or deleted); (j) via and plug photoresist LWR is not critical and faster resists can be used; (k) the size of the features can be fabricated as a single shape and size, and may be applicable for electron beam direct write (EBDW) processes; and (k) via design rules are simplified and all possible vias are allowed in any geometric configuration, where the size of the vias is completely defined by the intersection of the metal above and below.

FIGS. 1-13 illustrate portions of integrated circuit layers representing various operations in a method of self-aligned via and metal patterning, in accordance with an embodiment of the present invention. In each illustration at each described operation, plan views are shown on the left-hand side, and corresponding cross-sectional views are shown on the right-hand side. These views will be referred to herein as corresponding cross-sectional views and plan views.

FIG. 1 illustrates a plan view and corresponding cross-sectional views of options for a previous layer metallization structure, in accordance with an embodiment of the present invention. Referring to the plan view and corresponding cross-section view option (a), a starting structure 100 includes a pattern of metal lines 102 and interlayer dielectric (ILD) lines 104. The starting structure 100 may be patterned in a grating-like pattern with metal lines spaced at a constant pitch and having a constant width, as is depicted in FIG. 1 if self-assembling materials are being used. If a directed selective growth technique is used, then the underlying pattern does not have to be a single pitch or width. The pattern, for example, may be fabricated by a pitch halving or pitch quartering approach. Some of the lines may be associated with underlying vias, such as line 102' shown as an example in the cross-sectional views.

Referring again to FIG. 1, alternative options (b)-(f) address situations where an additional film is formed (e.g., deposited, grown, or left as an artifact remaining from a previous patterning process) on a surface of one of, or both of, the metal lines 102 and interlayer dielectric lines 104. In example (b), an additional film 106 is disposed on the interlayer dielectric lines 104. In example, (c), an additional film 108 is disposed on the metal lines 102. In example, (d) an additional film 106 is disposed on the interlayer dielectric lines 104, and an additional film 108 is disposed on the metal lines 102. Furthermore, although the metal lines 102 and the interlayer dielectric lines 104 are depicted as co-planar in (a), in other embodiments, they are not co-planar. For example, in (e), the metal lines 102 protrude above the interlayer dielectric lines 104. In example, (f), the metal lines 102 are recessed below the interlayer dielectric lines 104.

Referring again to examples (b)-(d), an additional layer (e.g., layer 106 or 108) can be used as a hardmask (HM) or protection layer or be used to enable a selective growth and/or self-assembly described below in association with subsequent processing operations. Such additional layers may also be used to protect the ILD lines from further processing. In addition, selectively depositing another material over the metal lines may be beneficial for similar reasons. Referring again to examples (e) and (f), it may also be possible to recess either the ILD lines or the metal lines with any combination of protective/HM materials on either or both surfaces. Overall, there exist numerous options at this stage for preparing ultimately underlying surfaces for a selective or directed self-assembly process.

In an embodiment, as used throughout the present description, interlayer dielectric (ILD) material, such as the material of the interlayer dielectric lines 104, is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material, such as the material of metal lines 102, is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect. As will be described further below, top surfaces of the lower interconnect lines may be used for self-aligned via and plug formation.

In an embodiment, as is also used throughout the present description, hardmask materials, such, as layers 106 or 108 if included as a hardmask, are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be understood that the layers and materials described in association with FIG. 1 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1 may be fabricated on underlying lower level interconnect layers.

Figure 2:
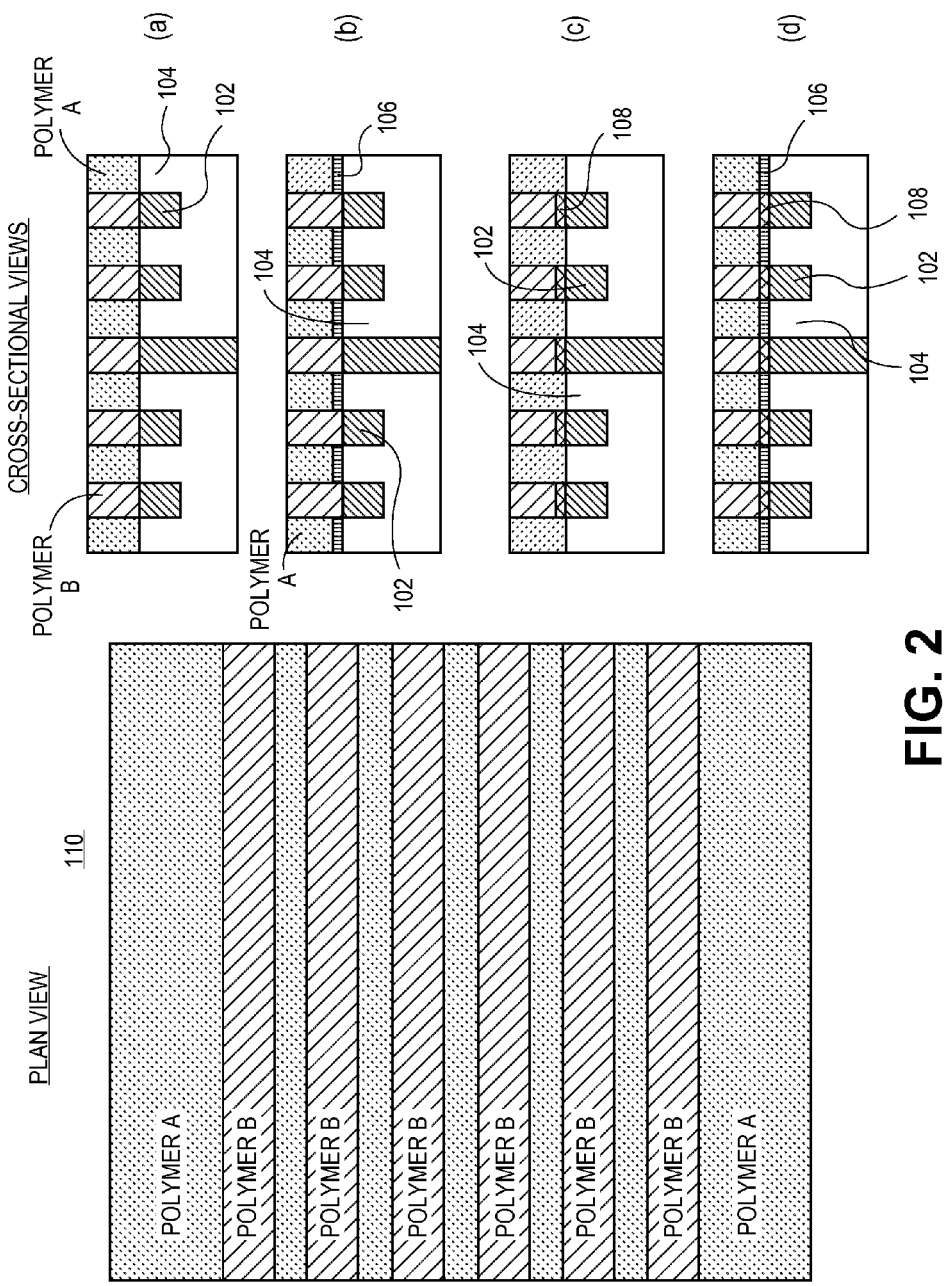

FIG. 2 illustrates a plan view and corresponding cross-sectional views of options for directed self-assembly (DSA) growth on an underlying metal/ILD grating (e.g., on a structure such as shown in FIG. 1), in accordance with an embodiment of the present invention. Referring to the plan view, the structure 110 includes a layer with alternating polymers or alternating polymer components. For example, as shown, Polymer A (or polymer component A) is formed on or above the interlayer dielectric (ILD) lines 104 of FIG. 1, while Polymer B (or polymer component B) is formed on or above the metal lines 102 of FIG. 1. Referring to the cross-sectional views, in (a) Polymer A (or polymer component A) is formed on the ILD lines 104, and Polymer B (or polymer component B) is formed on the metal lines 102. In (b), Polymer A (or polymer component A) is formed on an additional film 106 formed on the ILD lines 104, while Polymer B (or polymer component B) is formed on the metal lines 102. In (c), Polymer A (or polymer component A) is formed on the ILD lines 104, while Polymer B (or polymer component B) is formed on an additional film 108 formed on the metal lines 102. In (d), Polymer A (or polymer component A) is formed on an additional film 106 formed on the ILD lines 104, and Polymer B (or polymer component B) is formed on an additional film 108 formed on the metal lines 102.

Referring again to FIG. 2, in an embodiment, once the surface of the underlying structure (e.g., structure 100 of FIG. 1) has been prepared, a 50-50 diblock copolymer, such as polystyrene-polymethyl methacrylate (PS-PMMA), is coated on the substrate and annealed to drive self assembly, leading to the Polymer A/Polymer B layer of structure 110 of FIG. 2. In one such embodiment, with appropriate surface energy conditions, the block copolymers segregate based on the underlying material of structure 100. For example, in a specific embodiment, polystyrene aligns selectively to the underlying metal lines 102 (or corresponding metal line cap or hardmask material). Meanwhile, the polymethyl methacrylate aligns selectively to the ILD lines 104 (or corresponding metal line cap or hardmask material).

Thus, in an embodiment, the underlying metal and ILD grid is recreated in the block co-polymer (BCP, i.e., Polymer A/Polymer B). This can particularly be so if the BCP pitch is commensurate with the underlying grating pitch. The polymer grid (Polymer A/Polymer B) is, in one embodiment, robust against certain small deviations from a perfect grid such. For example, if small plugs effectively place an oxide or like material where a perfect grid would have metal, a perfect Polymer A/Polymer B grid can still be achieved. However, since the ILD lines grating is, in one embodiment, an idealized grating structure, with no metal disruptions of the ILD backbone, it may be necessary to render the ILD surface neutral since both types of polymer (A and B) will, in such an instance, be exposed to ILD like material while only one type is exposed to metal.

In an embodiment, the thickness of the coated polymer (Polymer A/B) is approximately the same as, or slightly thicker than, the ultimate thickness of an ILD ultimately formed in its place. In an embodiment, as described in greater detail below, the polymer grid is formed not as an etch resist, but rather as scaffolding for ultimately growing a permanent ILD layer there around. As such, the thickness of the polymer (A/B) can be important since it may be used to define the ultimate thickness of a subsequently formed permanent ILD layer. That is, in one embodiment, the polymer grating shown in FIG. 2 is eventually replaced with an ILD grating of roughly the same thickness.

In an embodiment, as mentioned above, the grid of Polymer A/Polymer B of FIG. 2 is a block copolymer. In one such embodiment, the block copolymer molecule is a polymeric molecule formed of a chain of covalently bonded monomers. In a block copolymer, there are at least two different types of monomers, and these different types of monomers are primarily included within different blocks or contiguous sequences of monomers. The illustrated block copolymer molecule includes a block of Polymer A and a block of Polymer B. In an embodiment, the block of Polymer A includes predominantly a chain of covalently linked monomer A (e.g., A-A-A-A-A . . . ), whereas the block of Polymer B includes predominantly a chain of covalently linked monomer B (e.g., B-B-B-B-B . . . ). The monomers A and B may represent any of the different types of monomers used in block copolymers known in the arts. By way of example, the monomer A may represent monomers to form polystyrene, and the monomer B may represent monomers to form poly(methyl methacrylate) (PMMA), although the scope of the invention is not so limited. In other embodiments, there may be more than two blocks. Moreover, in other embodiments, each of the blocks may include different types of monomers (e.g., each block may itself be a copolymer). In one embodiment, the block of Polymer A and the block of Polymer B are covalently bonded together. The block of Polymer A and the block of Polymer B may be of approximately equal length, or one block may be significantly longer than the other.

Typically, the blocks of block copolymers (e.g., the block of Polymer A and the block of Polymer B) may each have different chemical properties. As one example, one of the blocks may be relatively more hydrophobic (e.g., water repelling) and the other may be relatively more hydrophilic (water attracting). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of a first example (as shown in FIG. 2), in two block copolymers, if the blocks are approximately the same length, a grid like pattern of alternating Polymer A lines and Polymer B lines is generated. In another embodiment, by way of a second example (not shown), in two block copolymers, if one of the blocks is longer than the other, but not too much longer than the other, vertical columnar structures may formed. In the columnar structures, the block copolymer molecules may align with their shorter polymer blocks microphase separated into the interior of the columns and their longer polymer blocks extending away from the columns and surrounding the columns. For example, if the block of Polymer A were longer than the block of Polymer B, but not too much longer, columnar structures may formed in which many block copolymer molecules align with their shorter blocks of Polymer B forming columnar structures surrounded by a phase having the longer blocks of Polymer A. When this occurs in an area of sufficient size, a two-dimensional array of generally hexagonally-packed columnar structures may be formed.

In an embodiment, the Polymer A/Polymer B grating is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located, which is in contrast to the assembled block copolymer layer portion discussed in association with the resulting structure of FIG. 2. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the arts for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules.

In one such embodiment, an annealing treatment may be applied to the unassembled block copolymer in order to initiate, accelerate, increase the quality of, or otherwise promote microphase separation and/or self-assembly. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of forces such as surface tension, molecular likes and dislikes, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines). In some embodiments, they may be used to form nano-scale lines or other nano-scale structures that can ultimately be used to form via and openings. In some embodiments, directed self assembly of block copolymers may be used to form vias that are self aligned with interconnects, as described in greater detail below.

Figure 3:
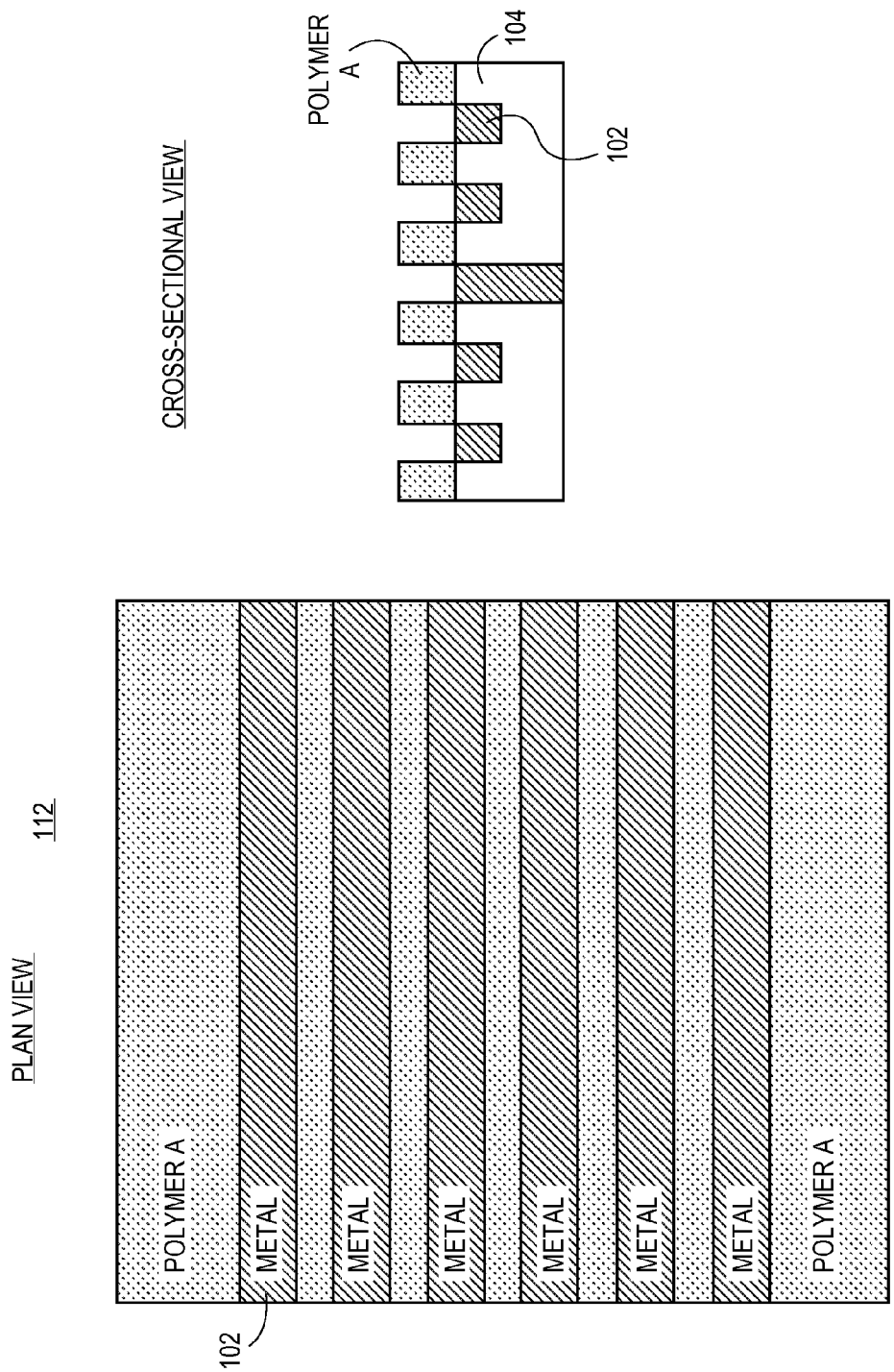

FIG. 3 illustrates a plan view and corresponding cross-sectional view of the structure of FIG. 2 following removal of one species of polymer, in accordance with an embodiment of the present invention. Referring to FIG. 3, Polymer B is removed to re-expose the metal lines 102 (or hardmask or cap layers formed on the metal lines 102), while Polymer A is retained in the ILD lines 104, forming structure 112. In an embodiment, a deep ultra-violet (DUV) flood expose followed by a wet etch or a selective dry etch is used to selectively remove Polymer B. It is to be understood that, instead of first removal of the polymer from the metal lines 102 (as depicted), removal from the ILD lines may instead be first performed.

Figure 4:
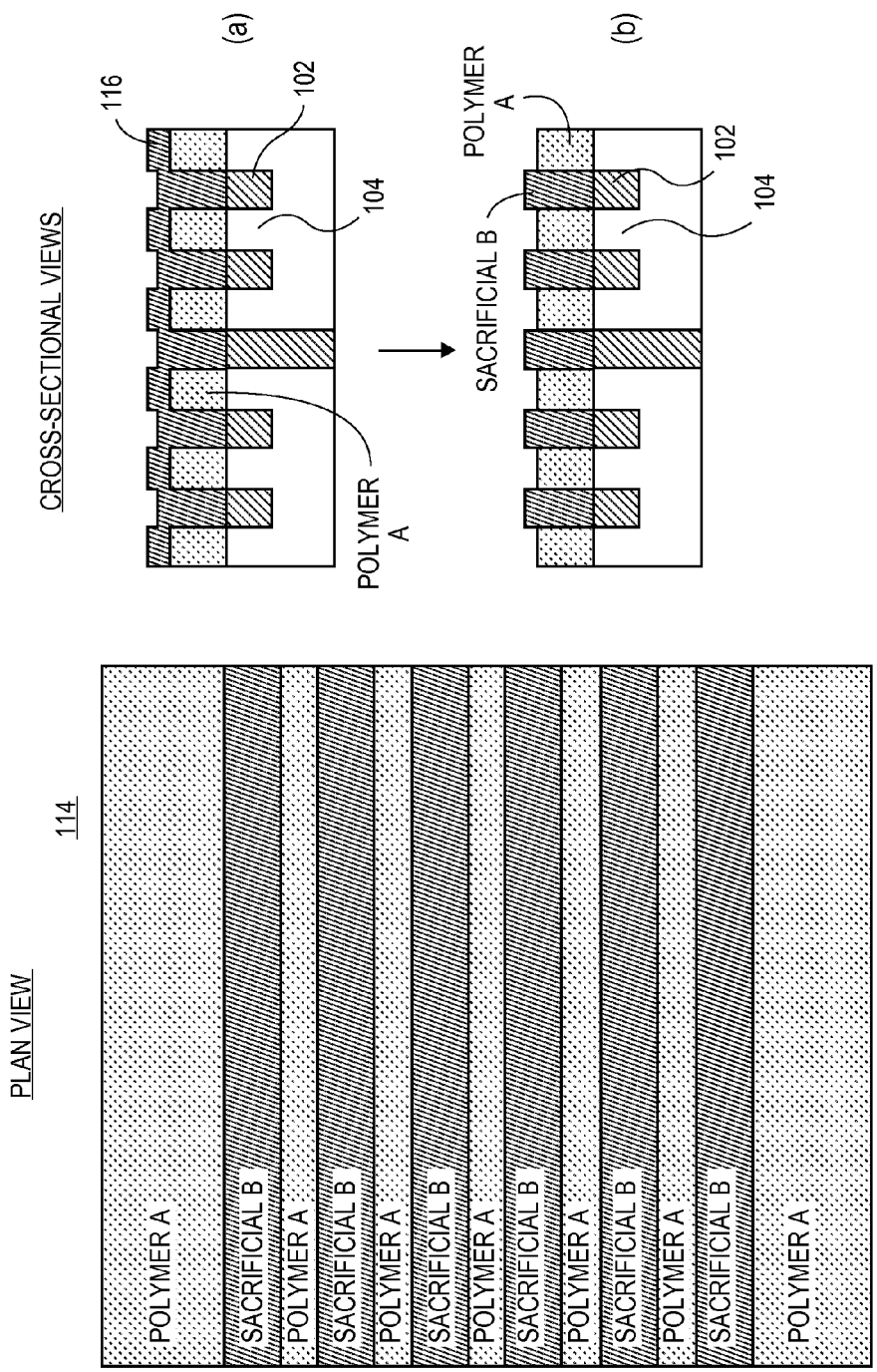

FIG. 4 illustrates a plan view and corresponding cross-sectional views of the structure of FIG. 3 following formation of a sacrificial material layer over the metal lines 102, in accordance with an embodiment of the present invention. Referring to the plan view and corresponding cross-sectional view (b), structure 114 includes a Sacrificial B layer formed above or on the metal lines 102 and between the Polymer A lines which are above or on the ILD lines 104. In an embodiment, referring to cross-sectional view (a), a low temperature deposition fills trenches between Polymer A lines, e.g., with an oxide (e.g., $TiO_x$) or other sacrificial material as a conformal layer 116. The conformal layer 116 is then confined to regions above metal lines 102 by a dry etch or chemical mechanical planarization (CMP) process. The resulting layer is referred to herein as Sacrificial B, since in some embodiments the material is ultimately replaced with a permanent ILD material. However, in other embodiments, it is to be understood that a permanent ILD material may instead be formed at this stage. In the case that a sacrificial material is used, in an embodiment, the sacrificial material has the requisite deposition properties, thermal stability, and etch selectivity to other materials used in the process.

Figure 5:
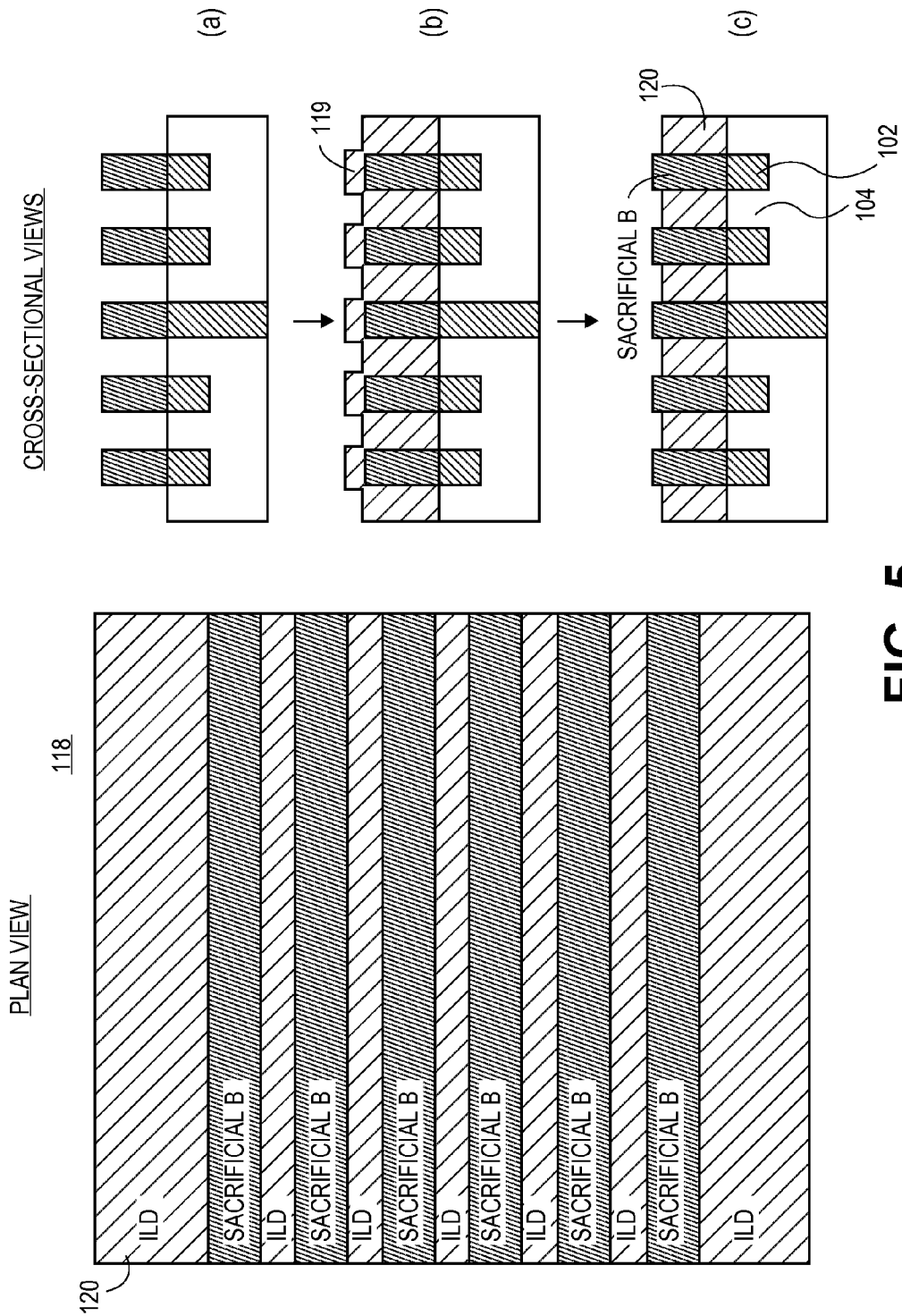

FIG. 5 illustrates a plan view and corresponding cross-sectional views of the structure of FIG. 4 following replacement of Polymer A with a permanent interlayer dielectric (ILD) material, in accordance with an embodiment of the present invention. Referring to the plan view and corresponding cross-sectional view (c), structure 118 includes permanent interlayer dielectric (ILD) lines 120 on or above the ILD lines 104 and between the Sacrificial B material lines. In an embodiment, as depicted in cross-sectional view (a), the Polymer A lines are removed. Then, referring to cross-sectional view (b), an ILD material layer 119 is formed conformally over the resulting structure. The conformal layer 119 is then confined to regions above the ILD lines 104 by a dry etch or chemical mechanical planarization (CMP) process. In an embodiment, the structure 118 effectively replaces the polymer (A/B) grating of FIG. 2 with a very thick material grating (e.g., permanent ILD 120 and Sacrificial B) commensurate with the underlying metal grating and aligned with the underlying grating. The two different materials may be used to ultimately define possible locations for plugs and vias, as described in greater detail below.

Figure 6:
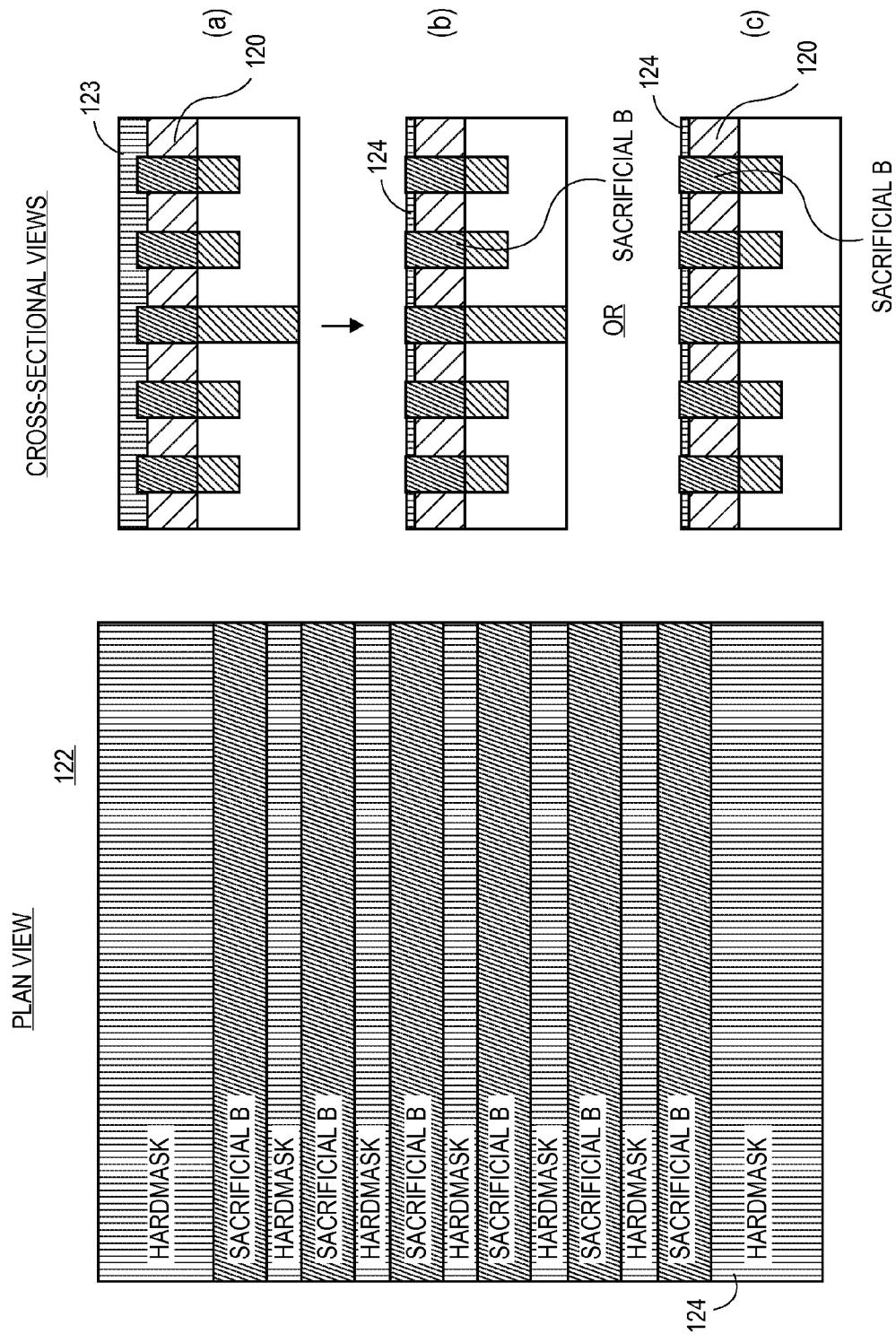

FIG. 6 illustrates a plan view and corresponding cross-sectional views of the structure of FIG. 5 following selective hardmask formation on the permanent ILD lines, in accordance with an embodiment of the present invention. Referring to the plan view and corresponding cross-sectional view (c), structure 122 includes a hardmask layer 124 formed on the permanent interlayer dielectric (ILD) lines 120. In one embodiment, referring to cross-sectional view (c), a selective growth process is used to form hardmask layer 124 as confined to the surfaces of the permanent ILD lines 120. In another embodiment, a conformal material layer 123 is first formed (cross-sectional view (a)) on a structure having recessed permanent ILD lines 120. The conformal layer 123 is then subjected to a timed etch and or CMP process to form hardmask layer 124 (cross-sectional view (b)). In the latter case, the ILD lines 120 are recessed relative to the Sacrificial B material and then a non-comformal (planarizing) hardmask 123 is deposited on the resulting grating. The material 123 is thinner on Sacrificial B lines than on the recessed ILD lines 120 such that a timed etch of the hardmask or a polish operation removes the material 123 selectively from the Sacrificial B material.

Figure 7:
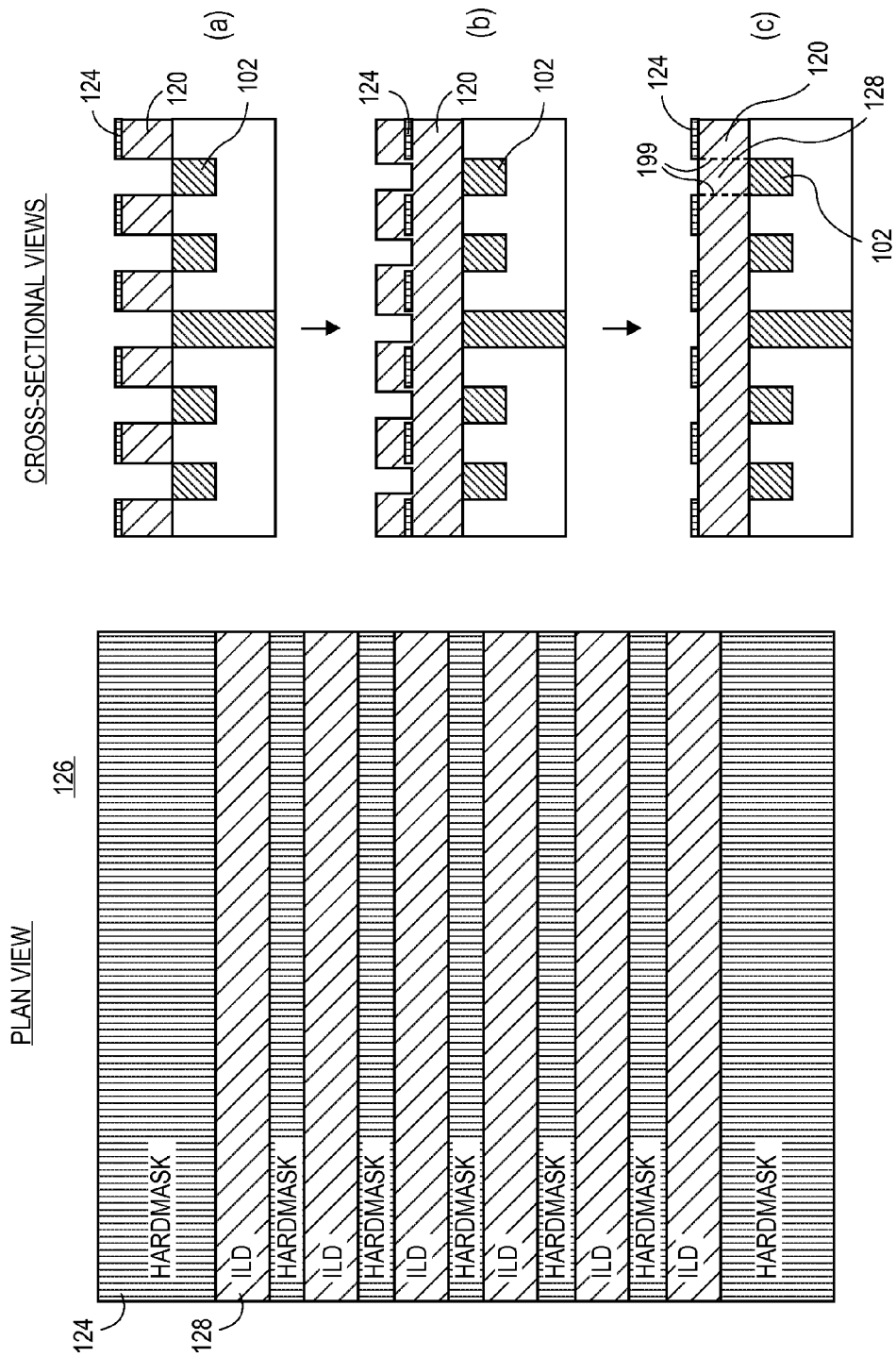

FIG. 7 illustrates a plan view and corresponding cross-sectional views of the structure of FIG. 6 following removal of Sacrificial B lines and replacement with permanent ILD lines 128, in accordance with an embodiment of the present invention. Referring to the plan view and corresponding cross-sectional view (c), structure 126 includes permanent ILD lines 18 in place of the Sacrificial B lines of FIG. 6, i.e., above and in alignment with the metal lines 102. In an embodiment, the Sacrificial B material is removed (cross-sectional view (a)) and replaced with permanent ILD lines 128 (cross-sectional view (c)), e.g., by deposition of a conformal layer and subsequent timed etch or CMP processing (cross-sectional view (b)). In an embodiment, the resulting structure 126 includes a uniform ILD material (permanent ILD lines 120+permanent ILD lines 128) where the locations of all possible plugs are covered in hardmask 124 and all possible vias are in areas of exposed permanent ILD lines 128. In one such embodiment, permanent ILD lines 120 and permanent ILD lines 128 are composed of a same material. In another such embodiment, permanent ILD lines 120 and permanent ILD lines 128 are composed of different ILD materials. In either case, in a specific embodiment, a distinction such as a seam between the materials of permanent ILD lines 120 and permanent ILD lines 128 may be observed in the final structure 126. Exemplary seams 199 are shown in FIG. 7 for illustrative purposes.

Figure 8:
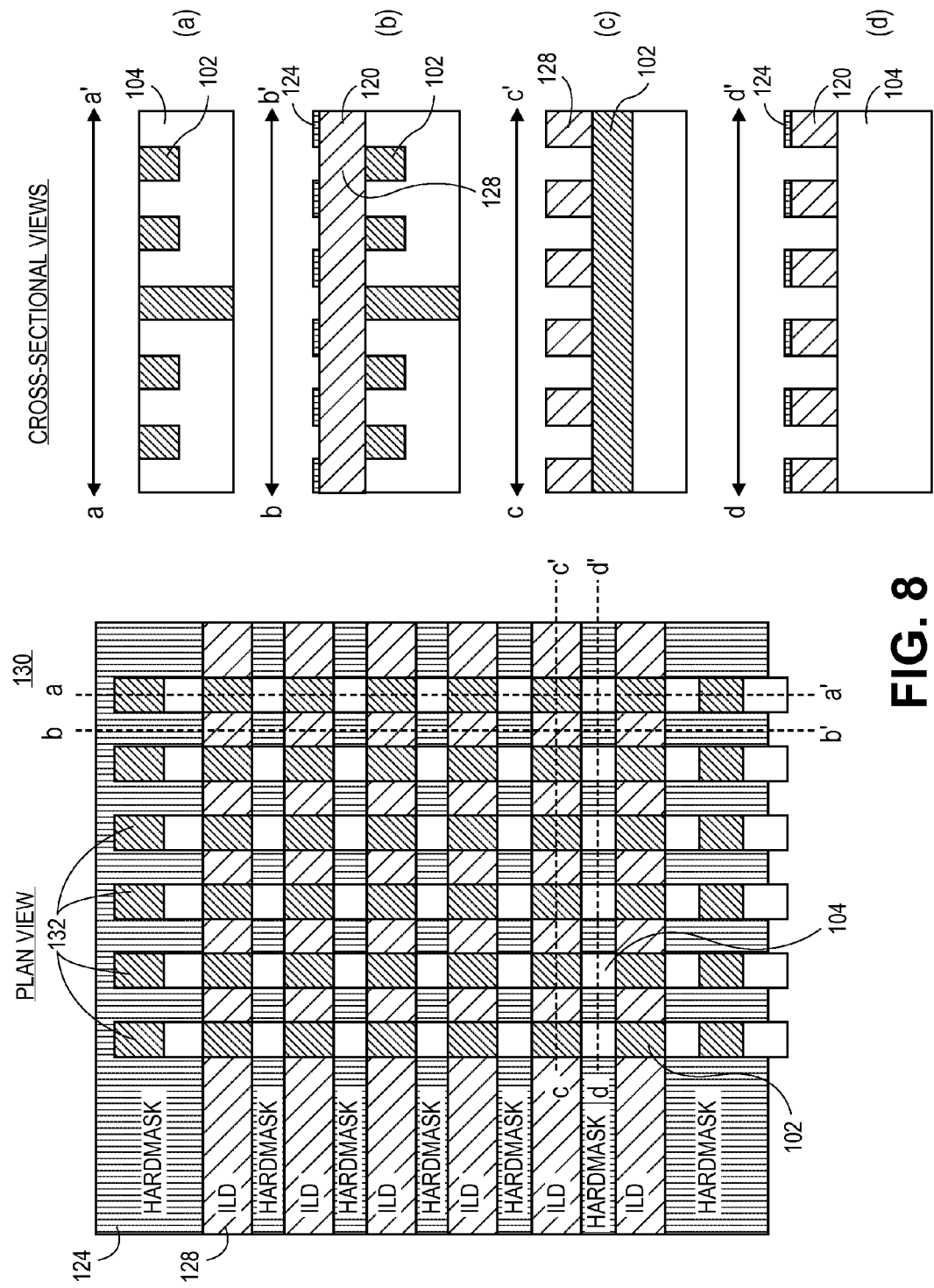

FIG. 8 illustrates a plan view and corresponding cross-sectional views of the structure of FIG. 7 following trench formation (e.g., grating definition), in accordance with an embodiment of the present invention. Referring to the plan view and corresponding cross-sectional views (a)-(d) taken along axes, a-a', b-b', c-c' and d-d', respectively, a grating in structure 130 for ultimately defining regions between a pattern of metal lines is defined by forming trenches 132 in the structure of FIG. 7, perpendicular to the grating of FIG. 7. In an embodiment, the trenches 132 are formed by patterning and etching a grating pattern into the sacrificial grating of earlier structures. In one embodiment, a grid is formed, effectively, defining the location of all spaces between ultimately formed metal lines along with all plugs and vias simultaneously. In an embodiment, the trenches 132 reveal portions of underlying ILD lines 104 and metal lines 102.

Figure 9:
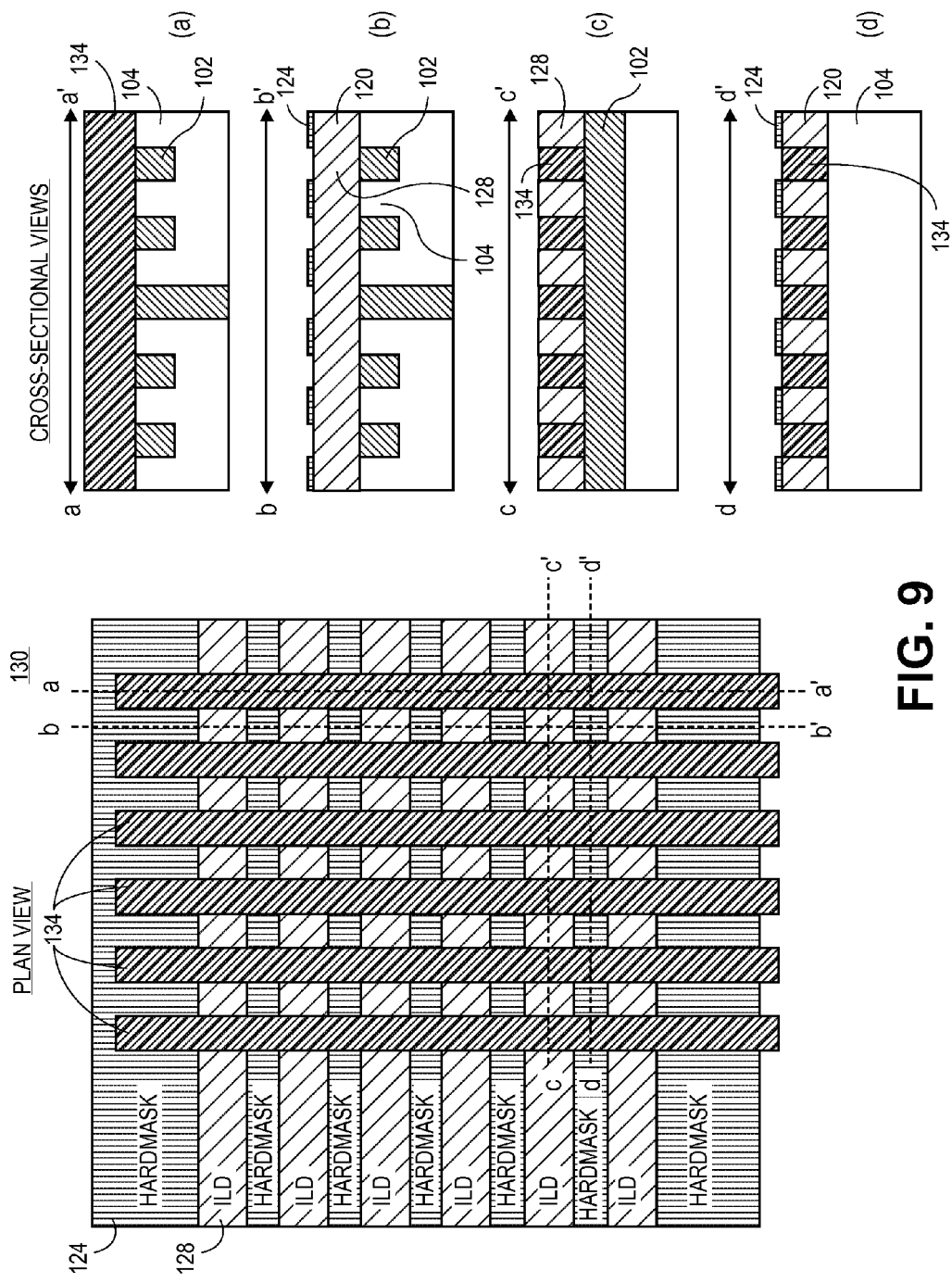

FIG. 9 illustrates a plan view and corresponding cross-sectional views of the structure of FIG. 8 following formation of a sacrificial material grating in the trenches of FIG. 8, in accordance with an embodiment of the present invention. Referring to the plan view and corresponding cross-sectional views (a)-(d) taken along axes, a-a', b-b', c-c' and d-d', respectively, a material layer 134, which is an interlayer dielectric layer or sacrificial layer is formed in the trenches 132 of the structure of FIG. 8. In an embodiment, the material layer 134 is formed by conformal deposition and subsequent timed etch or CMP with permanent ILD material or a sacrificial layer (e.g., which can be later removed if an air gap is to be fabricated). In the former case, the material layer 134 ultimately becomes ILD material between subsequently formed parallel metal lines on a same metal layer. In the latter case, the material may be referred to as Sacrificial C material, as depicted. In one embodiment, material layer 134 has a high etch selectivity to other ILD material and to the hardmask layer 128.

Figure 10:
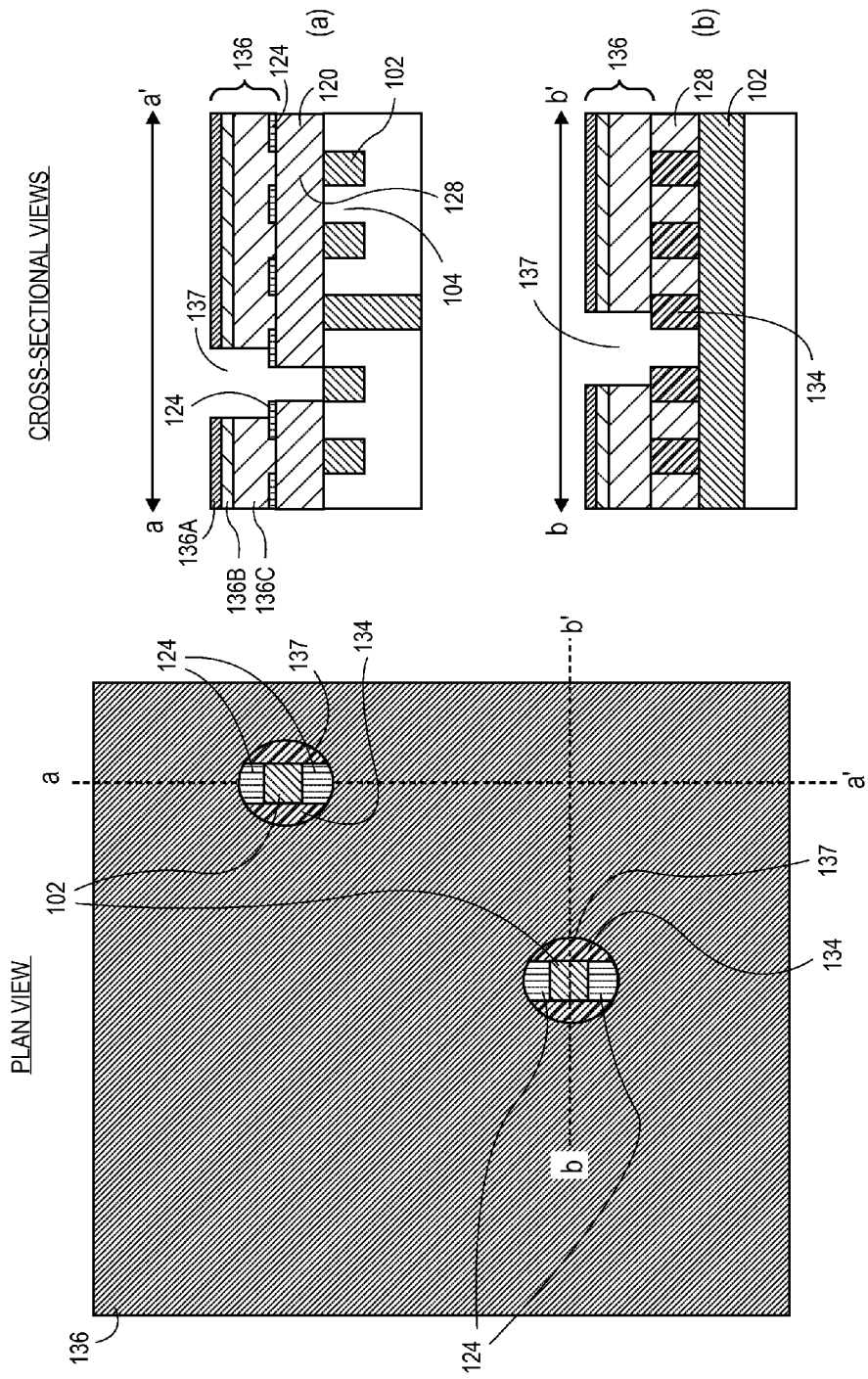

FIG. 10 illustrates a plan view and corresponding cross-sectional views of the structure of FIG. 9 following formation and patterning of a mask and subsequent etching of via locations, in accordance with an embodiment of the present invention. Referring to the plan view and corresponding cross-sectional views (a) and (b) taken along axes, a-a' and b-b', respectively, a mask 136 is formed on the structure of FIG. 9. The mask is patterned, e.g., by a lithographic process, to have openings 137 formed therein. In an embodiment, the openings are determined based on desired via patterning. That is, at this stage, all possible vias and plugs (e.g., as placeholders) have been patterned and are self aligned to the ultimate metal layers above and below. Here, a subset of the vias and plug locations is selected for preservation, as are locations for etching metal line positions. In one embodiment, an ArF or EUV or ebeam resist is used to cut or select the vias to be etched, i.e., at locations of the exposed portions of metal lines 102. It is to be understood that the hardmask 124 and the material layer 134 act as the actual etch masks which determine the shape and position of the vias. The mask 136 merely serves to block the remaining vias from being etched. As such, tolerance on opening 137 size is relaxed since the surrounding materials (e.g., hardmask 124 and material layer 134) of the selected via locations (i.e., the portion of openings 137 directly above the exposed portions of the metal lines 102) are resistant to the etch process used to remove the ILD line 128 above the selected portions of the metal lines 102 for ultimate via fabrication. In one embodiment, the mask 136 is composed of a topographic masking portion 136c, an anti-reflective coating (ARC) layer 136b, and a photoresist layer 136b. In a particular such embodiment, the topographic masking portion 136c is a carbon hardmask (CHM) layer and the anti-reflective coating layer 136b is a silicon ARC layer.

Figure 11:
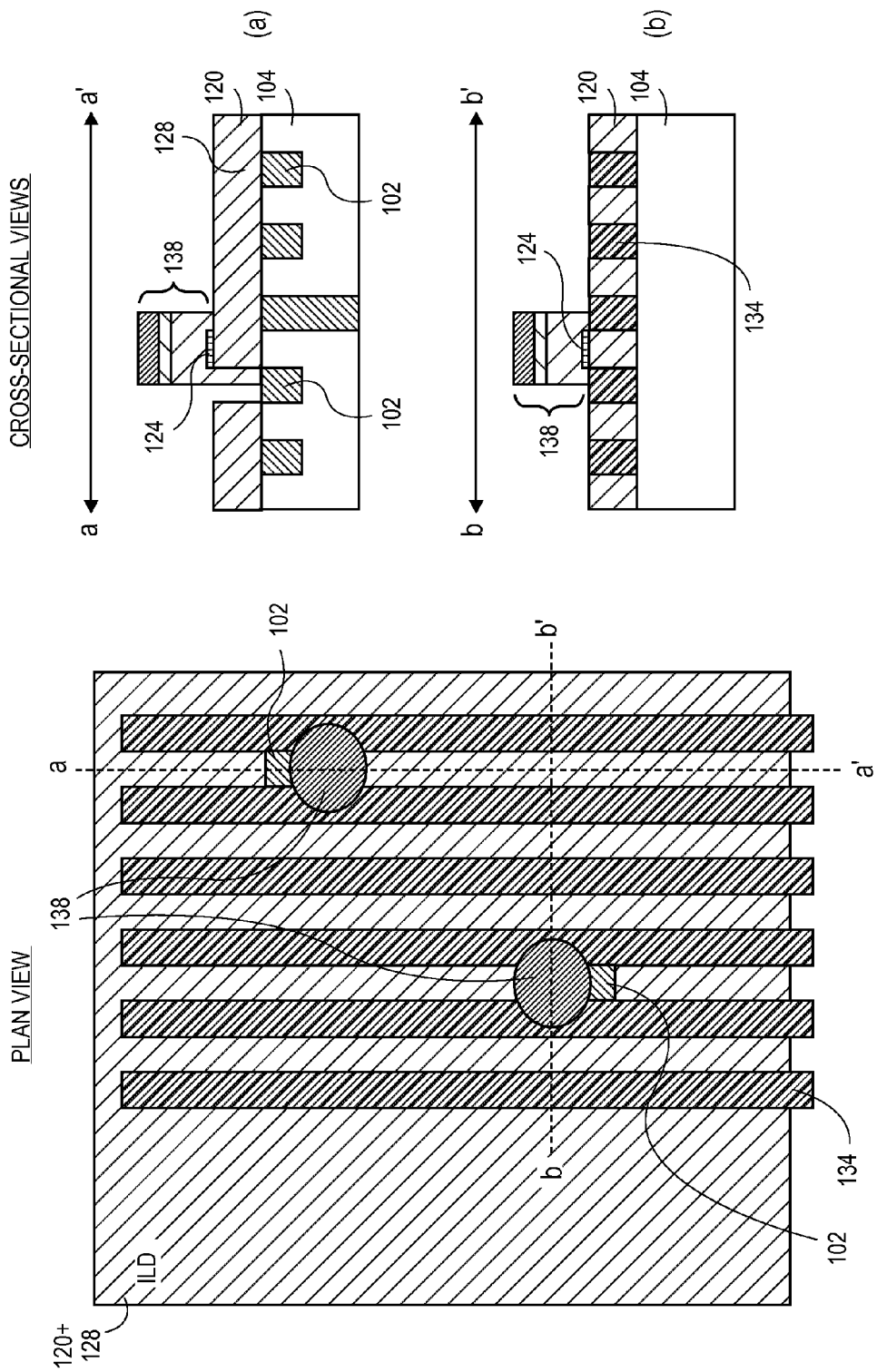

FIG. 11 illustrates a plan view and corresponding cross-sectional views of the structure of FIG. 10 following mask and hardmask removal and subsequent plug patterning and etch, in accordance with an embodiment of the present invention. Referring to the plan view and corresponding cross-sectional views (a) and (b) taken along axes, a-a' and b-b', respectively, the mask 136 shown in FIG. 10 is removed following via location patterning. Subsequently, a second mask 138 is formed and patterned to cover selected plug locations. Specifically, in an embodiment, and as depicted in FIG. 11, portions of hardmask 124 are preserved in locations where plugs will ultimately be formed. That is, at this stage, all possible plugs in the form of hardmask plugs exist. The patterning operation of FIG. 11 serves to remove all hardmask 124 portions except those selected for plug preservation. The patterning effectively exposes a substantial portion of ILD lines 120 and 128, e.g., as a unified dielectric layer.

Figure 12:
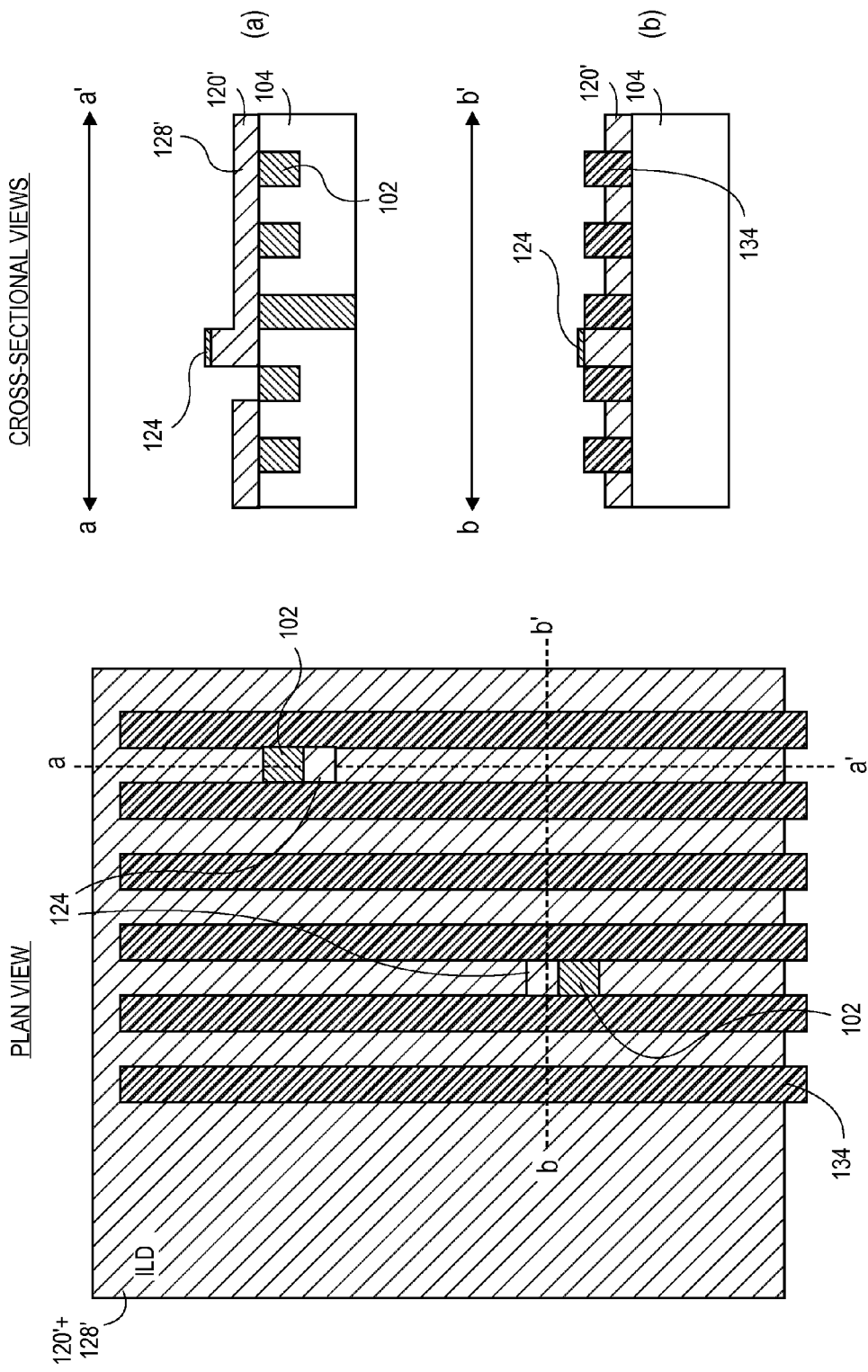

FIG. 12 illustrates a plan view and corresponding cross-sectional views of the structure of FIG. 11 following mask removal and metal line trench etch, in accordance with an embodiment of the present invention. Referring to the plan view and corresponding cross-sectional views (a) and (b) taken along axes, a-a' and b-b', respectively, the mask 138 shown in FIG. 11 is removed following via location patterning. Subsequently, a partial etch of the exposed portions of ILD lines 120 and 128 is performed to provide recessed ILD lines 120' and 128'. The extent of recess may be based on a timed etch process, as targeted to a depth of a desired metal line thickness. The portions of ILD lines 120 protected by the preserved hardmask 124 portions are not recessed by the etch, as depicted in FIG. 12. Additionally, the material layer 134 (which may be a sacrificial material or a permanent ILD material) is also not etched or recessed. It is to be understood that no lithography operation is needed for the process illustrated by FIG. 12 since the vias locations (at exposed portions of metal lines 102) have already been etched and the plugs (at locations where hardmask 124 was preserved).

Figure 13:
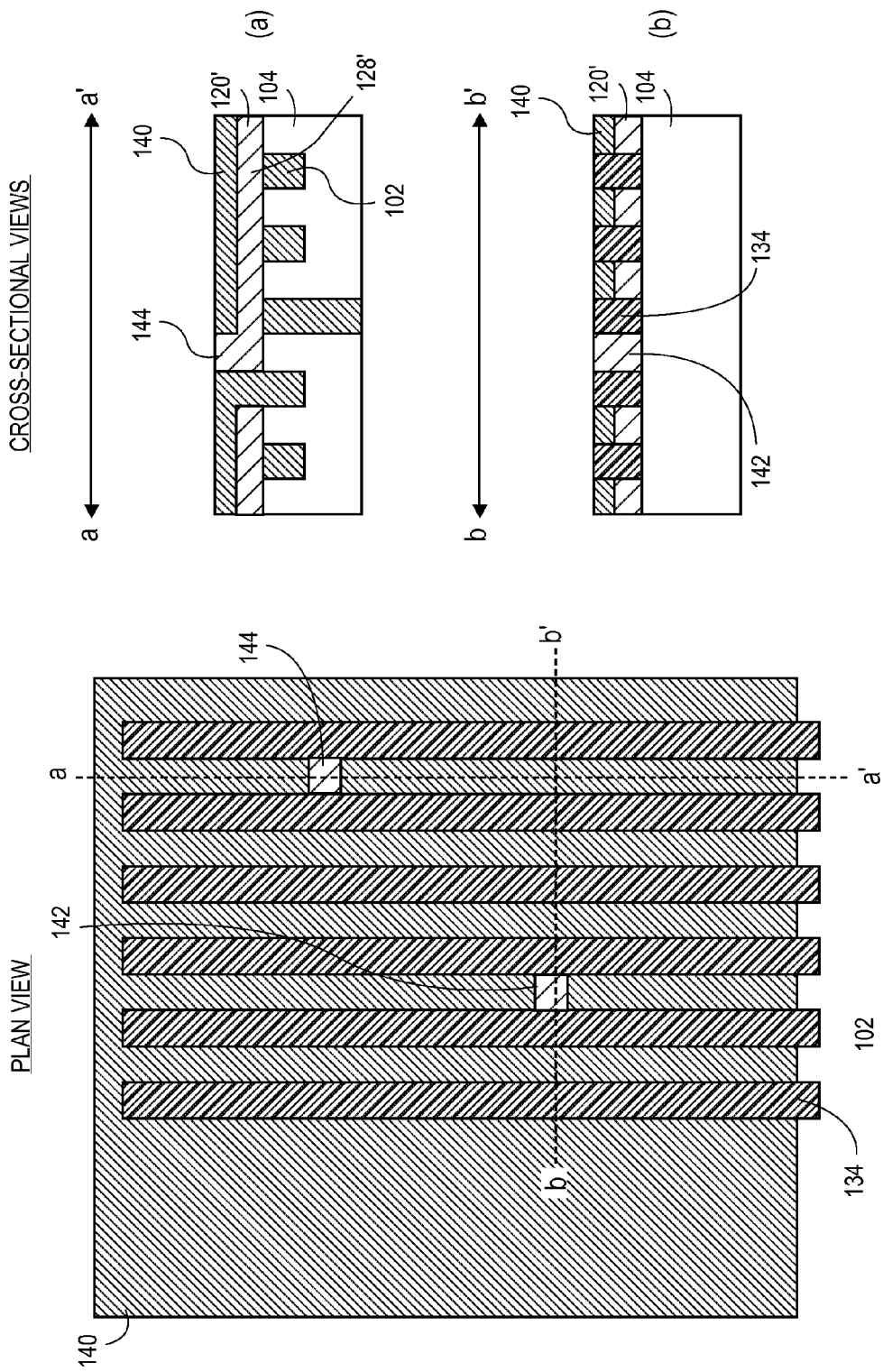

FIG. 13 illustrates a plan view and corresponding cross-sectional views of the structure of FIG. 12 following metal line deposition and polish, in accordance with an embodiment of the present invention. Referring to the plan view and corresponding cross-sectional views (a) and (b) taken along axes, a-a' and b-b', respectively, metal for forming metal interconnect lines is formed conformally above the structure of FIG. 12. The metal is then planarized, e.g., by CMP, to provide metal lines 140. The metal lines are coupled with underlying metal lines through the predetermined via locations, and are isolated by the preserved plugs 142 and 144. The metal (e.g., copper and associated barrier and seed layers) deposition and planarization process may be that of standard BEOL dual damascene processing. It is to be understood that, in subsequent fabrication operations, the material layer lines 134 may be removed to provide air gaps between the resulting metal lines 140.

The structure of FIG. 13 may subsequently be used as a foundation for forming subsequent metal line/via and ILD layers. Alternatively, the structure of FIG. 13 may represent the final metal interconnect layer in an integrated circuit. It is to be understood that the above process operations may be practiced in alternative sequences, not every operation need be performed and/or additional process operations may be performed. Furthermore, although the above process flow focused on applications of directed self-assembly (DSA), selective growth processes may be used instead in one or more locations of the process flow. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 14:
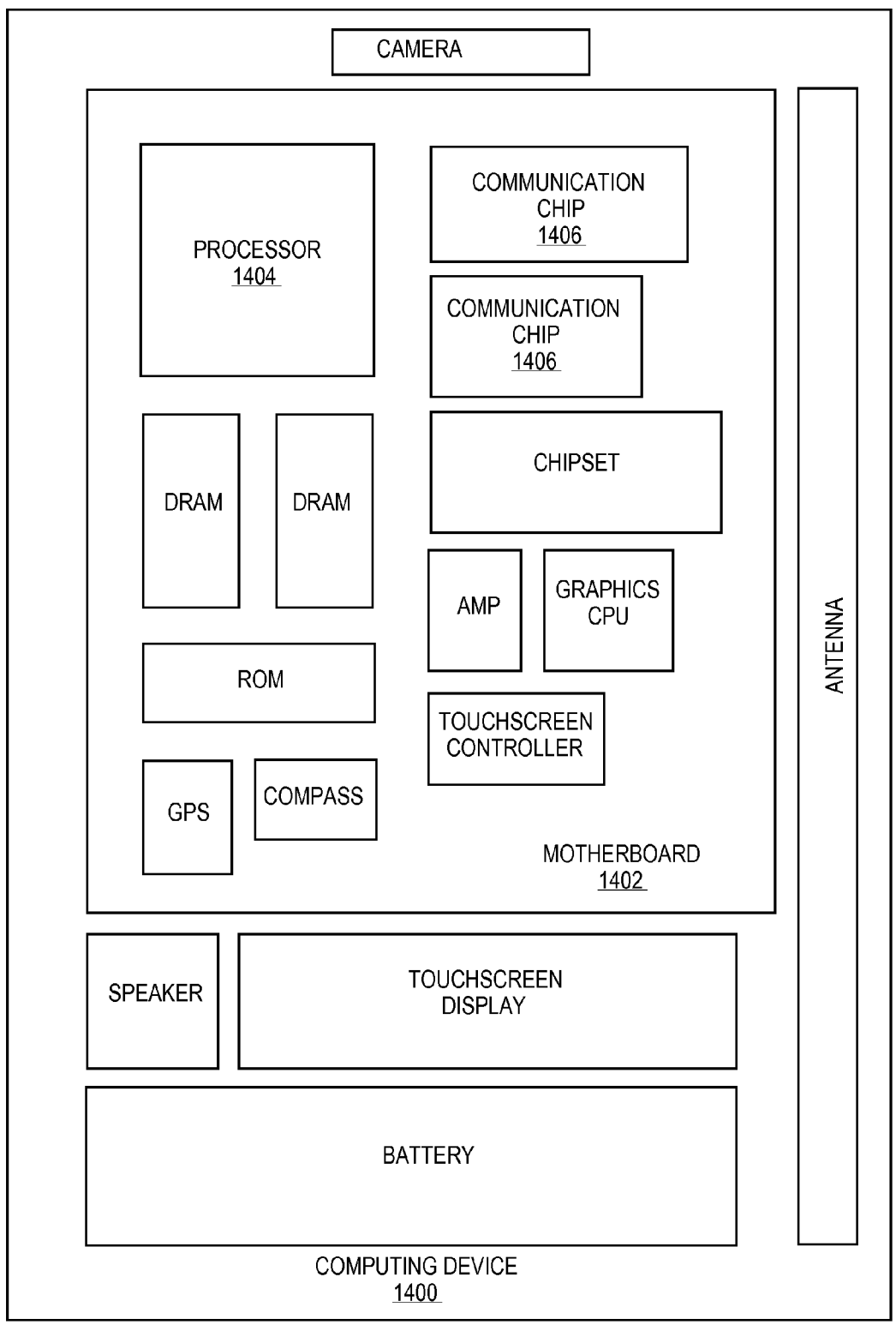
FIG. 14 illustrates a computing device in accordance with one implementation of the invention.

FIG. 14 illustrates a computing device 1400 in accordance with one implementation of the invention. The computing device 1400 houses a board 1402. The board 1402 may include a number of components, including but not limited to a processor 1404 and at least one communication chip 1406. The processor 1404 is physically and electrically coupled to the board 1402. In some implementations the at least one communication chip 1406 is also physically and electrically coupled to the board 1402. In further implementations, the communication chip 1406 is part of the processor 1404.

Depending on its applications, computing device 1400 may include other components that may or may not be physically and electrically coupled to the board 1402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 includes an integrated circuit die packaged within the processor 1404. In some implementations of the invention, the integrated circuit die of the processor includes one or more structures, such as previous layer self-aligned vias and plugs, built in accordance with implementations of the invention. The term "processor" may refer to any device or portion of a device that processes electronic data from registers and/or memory to transform that electronic data into other electronic data that may be stored in registers and/or memory.

The communication chip 1406 also includes an integrated circuit die packaged within the communication chip 1406. In accordance with another implementation of the invention, the integrated circuit die of the communication chip includes one or more structures, such as previous layer self-aligned vias and plugs, built in accordance with implementations of the invention.

In further implementations, another component housed within the computing device 1400 may contain an integrated circuit die that includes one or more structures, such as previous layer self-aligned vias and plugs, built in accordance with implementations of the invention.

In various implementations, the computing device 1400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

Thus, embodiments of the present invention include previous layer self-aligned via and plug patterning for back end of line (BEOL) interconnects.

In an embodiment, an interconnect structure for an integrated circuit includes a first layer disposed above a substrate. The first layer of the interconnect structure includes a grating of alternating metal lines and dielectric lines in a first direction. A second layer of the interconnect structure is disposed above the first layer. The second layer includes a grating of alternating metal lines and dielectric lines in a second direction, perpendicular to the first direction. Each metal line of the grating of the second layer is disposed on a recessed dielectric line composed of alternating distinct regions of a first dielectric material and a second dielectric material corresponding to the alternating metal lines and dielectric lines of the first layer of the interconnect structure.

In one embodiment, a metal line of the second layer is electrically coupled to a metal line of the first layer by a via having a center directly aligned with a center of the metal line of the first layer and with a center of the metal line of the second layer.

In one embodiment, a metal line of the second layer is disrupted by a plug having a center directly aligned with a center of a dielectric line of the first layer.

In one embodiment, the first dielectric material and the second dielectric material are different.

In one embodiment, the alternating distinct regions of the first dielectric material and the second dielectric material are separated by seams.

In one embodiment, the first dielectric material and the second dielectric material are the same.

In an embodiment, a method of fabricating an interconnect structure for an integrated circuit involves providing a previous layer metallization structure composed of an alternating metal line and dielectric line grating pattern having a first direction. The method also involves forming a sacrificial structure above the grating pattern. The method also involves replacing the portions of the sacrificial structure above and aligned with the metal lines of the grating pattern with a first dielectric layer and replacing the portions of the sacrificial structure above and aligned with the dielectric lines of the grating pattern with a second dielectric layer. The method also involves forming one or more via locations in the second dielectric layer, exposing portions of the metal lines of the grating pattern of the previous layer metallization structure. The method also involves recessing portions of the first and second dielectric layers. The method also involves forming a plurality of metal lines in the recessed portions of the first and second dielectric layers and metal vias in the one or more via locations, the plurality of metal lines having a second direction, perpendicular to the first direction.

In one embodiment, the method further involves forming one or more plug locations in the first dielectric layer.

In one embodiment, a metal line of the plurality of metal lines in the recessed portions of the first and second dielectric layers is electrically coupled to a metal line of the previous layer metallization structure by a via having a center directly aligned with a center of the metal line of the previous layer metallization structure and with a center of the metal line of the plurality of metal lines in the recessed portions of the first and second dielectric layers.

In one embodiment, forming the plurality of metal lines and metal vias involves forming and planarizing a metal layer.

In one embodiment, the method further involves forming an air-gap structure amongst the plurality of metal lines in the recessed portions of the first and second dielectric layers.

In one embodiment, forming the sacrificial structure above the grating pattern involves using a directed self-assembly (DSA) technique.

In one embodiment, forming the sacrificial structure involves forming a 50-50 diblock polystyrene-polymethyl methacrylate (PS-PMMA) copolymer.

In one embodiment, forming the sacrificial structure above the grating pattern involves using a selective growth technique.

In one embodiment, forming the first dielectric layer and the second dielectric material layer involves forming a different material.

In one embodiment, forming the first dielectric layer and the second dielectric material layer involves forming a same material.

In an embodiment, a method of fabricating an interconnect structure for an integrated circuit involves providing a previous layer metallization structure composed of an alternating metal line and dielectric line grating pattern having a first direction. The method also involves forming a polymer structure above the grating pattern, the polymer structure composed of a first polymer species disposed above and aligned with the metal lines of the grating pattern and a second polymer species disposed above and aligned with the dielectric lines of the grating pattern. The method also involves removing the first polymer species from the polymer structure. The method also involves forming a sacrificial material above and aligned with the metal lines of the grating pattern, and adjacent to the second polymer species. The method also involves removing the second polymer species from the polymer structure. The method also involves forming a first permanent dielectric layer above and aligned with the dielectric lines of the grating pattern, and adjacent to the sacrificial material. The method also involves replacing the sacrificial material with a second permanent dielectric layer, the second permanent dielectric material layer disposed above and aligned with the metal lines of the grating pattern, and adjacent to the first permanent dielectric layer. The method also involves forming a plurality of trenches in the first permanent dielectric layer and in the second permanent dielectric layer, the plurality of trenches having a grating pattern having a second direction, perpendicular to the first direction. The method also involves forming a dielectric material in the plurality of trenches. The method also involves etching one or more via locations in the second permanent dielectric layer, exposing portions of the metal lines of the grating pattern of the previous layer metallization structure. The method also involves protecting one or more plug locations by forming a hardmask pattern on portions of the first permanent dielectric layer. The method also involves recessing exposed portions of the first and second permanent dielectric layers. The method also involves forming a metal layer in the recessed portions of the first and second permanent dielectric layers.

In one embodiment, the method further involves forming a hardmask on the first permanent dielectric layer, wherein the hardmask protects the first permanent dielectric layer during the etching of the via locations in the second permanent dielectric layer, and wherein protecting the one or more plug locations by forming the hardmask pattern involves forming the hardmask pattern from the hardmask.

In one embodiment, the method further involves removing the dielectric material in the plurality of trenches to form an air-gap structure.

In one embodiment, forming the polymer structure above the grating pattern involves using a directed self-assembly (DSA) technique.

In one embodiment, forming the polymer structure involves forming a 50-50 diblock polystyrene-polymethyl methacrylate (PS-PMMA) copolymer.

In one embodiment, forming the polymer structure above the grating pattern involves using a selective growth technique.

In one embodiment, forming the first permanent dielectric layer and the second permanent dielectric material layer involves forming a different material.

In one embodiment, forming the first permanent dielectric layer and the second permanent dielectric material layer involves forming a same material.

What is claimed is:

1. A method of fabricating an interconnect structure for an integrated circuit, the method comprising:
    providing a previous layer metallization structure comprising an alternating metal line and dielectric line grating pattern having a first direction;
    forming a sacrificial structure above the grating pattern;
    replacing the portions of the sacrificial structure above and aligned with the metal lines of the grating pattern with a first dielectric layer and replacing the portions of the sacrificial structure above and aligned with the dielectric lines of the grating pattern with a second dielectric layer;
    forming one or more via locations in the first dielectric layer, exposing portions of the metal lines of the grating pattern of the previous layer metallization structure;
    recessing portions of the first and second dielectric layers; and
    forming a plurality of metal lines in the recessed portions of the first and second dielectric layers and metal vias in the one or more via locations, the plurality of metal lines having a second direction, perpendicular to the first direction.

2. The method of claim 1, further comprising:
    forming one or more plug locations in the second dielectric layer.

3. The method of claim 1, wherein a metal line of the plurality of metal lines in the recessed portions of the first and second dielectric layers is electrically coupled to a metal line of the previous layer metallization structure by a via having a center directly aligned with a center of the metal line of the previous layer metallization structure and with a center of the metal line of the plurality of metal lines in the recessed portions of the first and second dielectric layers.

4. The method of claim 1, wherein forming the plurality of metal lines and metal vias comprises forming and planarizing a metal layer.

5. The method of claim 1, further comprising:
    forming an air-gap structure amongst the plurality of metal lines in the recessed portions of the first and second dielectric layers.

6. The method of claim 1, wherein forming the sacrificial structure above the grating pattern comprises using a directed self-assembly (DSA) technique.

7. The method of claim 6, wherein forming the sacrificial structure comprises forming a 50-50 diblock polystyrene-polymethyl methacrylate (PS-PMMA) copolymer.

8. The method of claim 1, wherein forming the sacrificial structure above the grating pattern comprises using a selective growth technique.

9. The method of claim 1, wherein forming the first dielectric layer and the second dielectric material layer comprises forming a different material.

10. The method of claim 1, wherein forming the first dielectric layer and the second dielectric material layer comprises forming a same material.

11. A method of fabricating an interconnect structure for an integrated circuit, the method comprising:
    providing a previous layer metallization structure comprising an alternating metal line and dielectric line grating pattern having a first direction;
    forming a polymer structure above the grating pattern, the polymer structure comprising a first polymer species disposed above and aligned with the metal lines of the grating pattern and a second polymer species disposed above and aligned with the dielectric lines of the grating pattern;
    removing the first polymer species from the polymer structure;
    forming a sacrificial material above and aligned with the metal lines of the grating pattern, and adjacent to the second polymer species;
    removing the second polymer species from the polymer structure;
    forming a first permanent dielectric layer above and aligned with the dielectric lines of the grating pattern, and adjacent to the sacrificial material;
    replacing the sacrificial material with a second permanent dielectric layer, the second permanent dielectric material layer disposed above and aligned with the metal lines of the grating pattern, and adjacent to the first permanent dielectric layer;
    forming a plurality of trenches in the first permanent dielectric layer and in the second permanent dielectric layer, the plurality of trenches having a grating pattern having a second direction, perpendicular to the first direction;
    forming a dielectric material in the plurality of trenches;
    etching one or more via locations in the second permanent dielectric layer, exposing portions of the metal lines of the grating pattern of the previous layer metallization structure;
    protecting one or more plug locations by forming a hardmask pattern on portions of the first permanent dielectric layer;
    recessing exposed portions of the first and second permanent dielectric layers; and
    forming a metal layer in the recessed portions of the first and second permanent dielectric layers.

12. The method of claim 11, further comprising:
    forming a hardmask on the first permanent dielectric layer, wherein the hardmask protects the first permanent dielectric layer during the etching of the via locations in the second permanent dielectric layer, and wherein protecting the one or more plug locations by forming the hardmask pattern comprises forming the hardmask pattern from the hardmask.

13. The method of claim 11, further comprising:
    removing the dielectric material in the plurality of trenches to form an air-gap structure.

14. The method of claim 11, wherein forming the polymer structure above the grating pattern comprises using a directed self-assembly (DSA) technique.

15. The method of claim 14, wherein forming the polymer structure comprises forming a 50-50 diblock polystyrene-polymethyl methacrylate (PS-PMMA) copolymer.

16. The method of claim 11, wherein forming the polymer structure above the grating pattern comprises using a selective growth technique.

17. The method of claim 11, wherein forming the first permanent dielectric layer and the second permanent dielectric material layer comprises forming a different material.

18. The method of claim 11, wherein forming the first permanent dielectric layer and the second permanent dielectric material layer comprises forming a same material.

* * * * *